United States Patent
Huemoeller et al.

(10) Patent No.: US 6,747,352 B1
(45) Date of Patent: Jun. 8, 2004

(54) INTEGRATED CIRCUIT HAVING MULTIPLE POWER/GROUND CONNECTIONS TO A SINGLE EXTERNAL TERMINAL

(75) Inventors: Ronald Patrick Huemoeller, Chandler, AZ (US); David Jon Hiner, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 72 days.

(21) Appl. No.: 10/223,749

(22) Filed: Aug. 19, 2002

(51) Int. Cl.$^7$ ................................................ H01L 23/48
(52) U.S. Cl. ...................... 257/738; 257/739; 257/758; 361/762; 361/767; 361/780; 438/612; 438/917
(58) Field of Search ................................. 257/738, 758, 257/774–777, 782–784, 666–668, 672–676; 436/617, 106

(56) References Cited

U.S. PATENT DOCUMENTS

| | | |
|---|---|---|
| 5,347,429 A | 9/1994 | Kohno et al. |
| 5,463,253 A | 10/1995 | Waki et al. |
| 5,474,957 A | 12/1995 | Urushima |
| 5,474,958 A | 12/1995 | Djennas et al. |
| 5,581,498 A | 12/1996 | Ludwig et al. |
| 5,674,785 A | 10/1997 | Akram et al. |
| 5,739,581 A | 4/1998 | Chillara et al. |
| 5,739,585 A | 4/1998 | Akram et al. |
| 5,798,014 A | 8/1998 | Weber |
| 5,835,355 A | 11/1998 | Dordi |
| 5,894,108 A | 4/1999 | Mostafazadeh et al. |
| 5,903,052 A | 5/1999 | Chen et al. |
| 5,952,611 A | 9/1999 | Eng et al. |
| 6,013,948 A | 1/2000 | Akram et al. |
| 6,034,427 A | 3/2000 | Lan et al. |
| 6,060,778 A | 5/2000 | Jeong et al. |
| 6,072,243 A | 6/2000 | Nakanishi |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,184,463 B1 | 2/2001 | Panchou et al. |
| 6,214,641 B1 | 4/2001 | Akram |
| 6,235,554 B1 | 5/2001 | Akram et al. |
| 6,329,278 B1 * | 12/2001 | Low et al. ................... 438/617 |
| 6,395,578 B1 | 5/2002 | Shin et al. |
| 6,449,169 B1 * | 9/2002 | Ho et al. .................... 361/762 |

FOREIGN PATENT DOCUMENTS

| | | |
|---|---|---|
| JP | 05136323 A | 1/1993 |
| JP | 05109975 A | 3/1993 |
| JP | 10-173085 | 6/1998 |

* cited by examiner

Primary Examiner—Dung A. Le
(74) Attorney, Agent, or Firm—Weiss, Moy & Harris, P.C.

(57) ABSTRACT

An integrated circuit having multiple power/ground connections to a single external terminal and method for manufacturing an integrated circuit provides an integrated circuit having a reduced number of external power/ground terminals. The multiple connections may be made by conductive circuit paths on one side of the substrate and a terminal pad on the same side of the substrate, with the conductive circuit paths leading from die terminals terminating at the terminal pad, or a via may be formed either directly above the terminal pad or contacting its circumference to provide a connection through from the opposite side of the substrate. Multiple vias may be formed above the terminal pad and within its circumference to provide connection of multiple die terminals to the terminal pad.

20 Claims, 2 Drawing Sheets

US 6,747,352 B1

INTEGRATED CIRCUIT HAVING MULTIPLE POWER/GROUND CONNECTIONS TO A SINGLE EXTERNAL TERMINAL

FIELD OF THE INVENTION

The present invention relates generally to semiconductor packaging, and more specifically, to a substrate having multiple connections to external terminals for providing electrical inter-connection between multiple power connections of one or more integrated circuit dies to a single external terminal.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and land grid array among other mounting configurations.

High-density interconnect schemes such as high-density ball grid arrays (BGAs) or land grid arrays (LGAs) typically have multiple power and ground balls or lands in the array in order to provide a low impedance connection from the die(s) to the external power supply connections. Multiple terminals are also used to provide improved heat transfer from the semiconductor die(s) to the mounting carrier (e.g., printed circuit board or socket). In one terminal arrangement of these packages, the entire center section of the array is dedicated to power and ground connections.

The thermal and electrical impedances of the terminal (e.g., solder ball or land) do not necessitate the multi-terminal connection arrangement. Rather, it is the impedance of the wire-bonding structure (if used) and the impedance of the circuit traces on the substrate that necessitate the use of multiple terminals.

Therefore, it would be desirable to provide a method and integrated circuit package having a reduced number of power and ground terminals, while maintaining a low electrical impedance and a low thermal impedance connection from the integrated circuit die(s) to ground and power supply terminals. It would similarly be desirable to provide a method and integrated circuit package providing a higher-density interconnect by reducing the number of required power and ground connections.

SUMMARY OF THE INVENTION

A substrate having multiple power supply and/or ground connections between one or more die terminals to a single external pad provides a lower pin count or higher-density interconnect integrated circuit package. The integrated circuit includes at least one integrated circuit die, a substrate for mounting and electrically interconnecting the integrated circuit die(s) and a cover for covering the integrated circuit die(s).

The substrate includes multiple terminal pads for connection to external terminals of the integrated circuit and multiple bond pads for connection to terminals of integrated circuit die(s) where at least two power and/or ground connections from among bond pads are connected to a single terminal pad.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figures 1A, 1B:
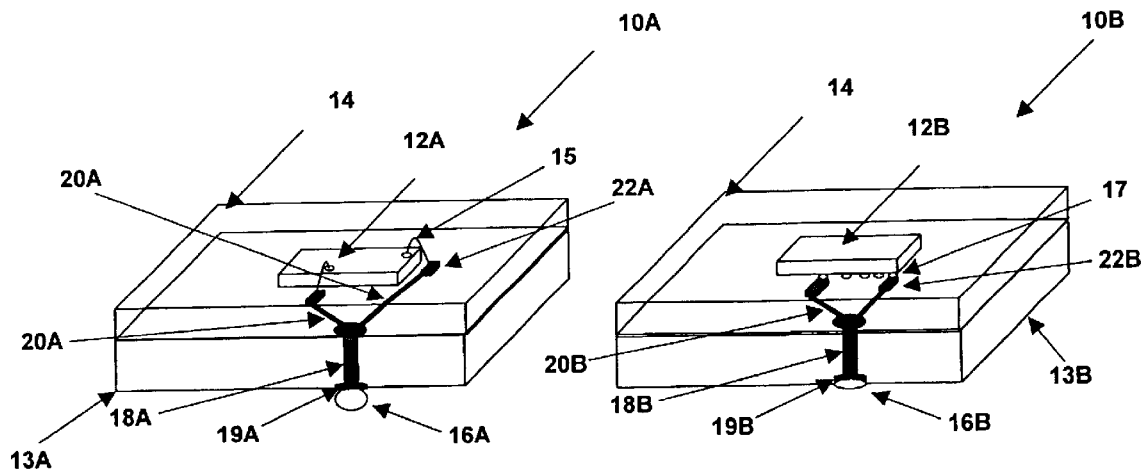
FIG. 1A is a pictorial diagram depicting features of an integrated circuit in accordance with an embodiment of the invention.
FIG. 1B is a pictorial diagram depicting features of an integrated circuit in accordance with another embodiment of the invention.

Referring now to the figures and in particular to FIG. 1A, an integrated circuit 10A, in accordance with an embodiment of the present invention is depicted. Integrated circuit 10A is a ball-grid array (BGA) package for a standard integrated circuit die 12A. Integrated circuit die 12A is bonded to the top side of a substrate 13A on which a plurality of circuit paths 20A are fabricated via etching, plating or sputtering. Circuit paths 20A may be formed above the top surface of substrate 13A or may be embedded beneath the surface by laser ablating channels, embossing the substrate or other means. Circuit paths 20A terminate in bond pads on which wires 15 are bonded, connecting integrated circuit terminals to circuit paths 20A. A cover 14 is applied over integrated circuit die 12A and attached to substrate 13A to protect the assembly from environmental conditions and handling damage. A plurality of solder balls 16A are attached to pads 19A for connecting integrated circuit die 12A to external circuits.

The present invention concerns connection of circuit traces 20A (and also any power and ground planes within a substrate) to pads 19A. Traditionally, only one connection is typically made between a bond pad and an integrated circuit terminal or ground plane, due to the design rules for circuit path widths and spacing. Also, vias are typically large, requiring a hole that is of significant size with respect to the pads, making only one via typically available per pad. The present invention reduces the size of conductive paths and vias through laser drilling vias and more precisely controlling an etching or plating process, or by embedding the conductive paths beneath the surface of the substrate. The present invention provides multiple connections to the pads, permitting reduction of the number of terminals used for connection of power and/or ground (which in this specification and appended claims should be understood to be contemplated by the term "power connections").

Thus in FIG. 1A, connection of a via 18A from pad 19A and to two conductive paths 20A, multiple power contacts on integrated circuit die 12A may be coupled to a single power pad 18A and to solder ball 16A. Electrical performance is not compromised significantly, as the impedance of wires 15 and the bonded ends, as well as die impedance is typically higher than the impedance of the connection between bond pads 22A and solder ball 16A. Also, thermal performance is improved, as the temperature differential between bond pads 22A is controlled within integrated circuit 10A, rather than being subject to external conditions (i.e., thermal differences between solder balls). Similarly to the electrical performance, the thermal impedance between bond pads 22A and solder ball 16A is typically much lower than the thermal impedance between die 12A connections and bond pads 22A.

FIG. 1B shows an integrated circuit 10B that includes a flip-chip semiconductor die 12B. Rather than bond pads, lands 22B for the attachment of solder balls or posts 17 from semiconductor die 12B to s substrate 13B are included. Other than the differences in die attach methodology, integrated circuit 10B is an example of a land grid array (LGA) including solder or other metal lands 16B for the connection of semiconductor die 12B to external circuits. While the figures illustrate a wire-bonded die in a BGA package and a flip-chip die in an LGA package, any combination of the above as well as other integrated circuits having packages and die connects may be fabricated using techniques and structures in accordance with embodiments of the present invention.

Figure 1C:
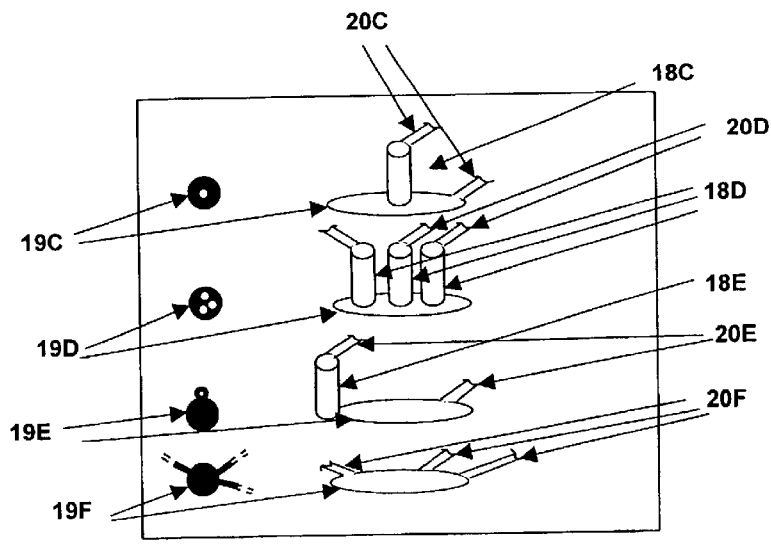
FIG. 1C is a pictorial diagram depicting various pad structures in accordance with embodiments of the invention.

FIG. 1C is a pictorial diagram depicting various multiple pad connections in accordance with embodiments of the present invention. Pad 19C is connected to a single via 18C that branches to multiple conductive paths 20C that carry power connections from multiple connection points of an integrated circuit die, power planes of a substrate or other terminal pads. Pad 19D is connected to multiple vertical vias 18D that lie within a cylinder having an axial cross section defined by the circumference of pad 19D. Circuit paths 20D individually extend from vias 18D to connect to other power connections within the integrated circuit (generally connections to power or ground terminals on one or more semiconductor dies).

Pad 19E includes a via 18E contacting the periphery of pad and circuit paths 20E extending from via 18E and pad 20E. It is notable that via 1BE is much smaller than a typical integrated circuit substrate via, as clearances to the next pads in the grid array must be maintained. Pad 19F is an example of an embodiment of the present invention without vias. Multiple connections 20F extend to integrated circuit die power or ground terminals, providing a connection from the power terminals to a single solder ball or land.

Figure 2A:
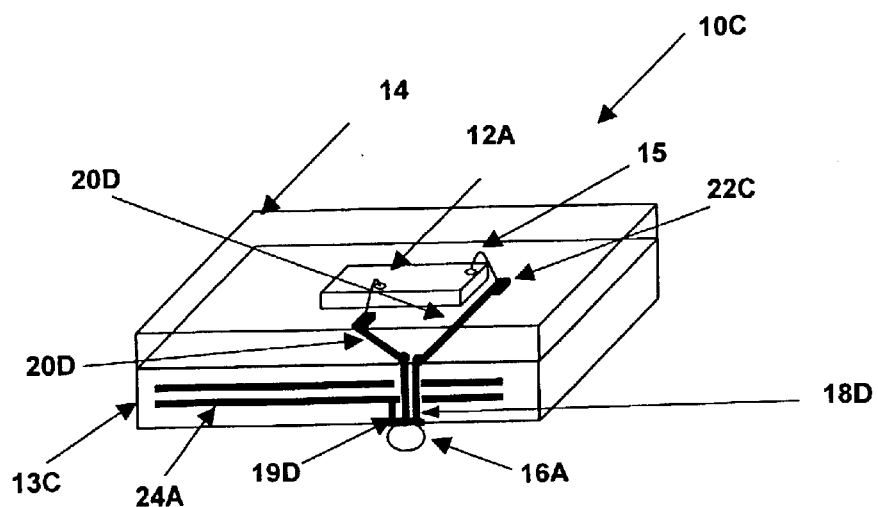
FIG. 2A is a pictorial diagram depicting features of an integrated circuit in accordance another embodiment of the invention.

Referring now to FIG. 2A, an integrated circuit 10C in accordance with another embodiment of the present invention is depicted. Integrated circuit 10C is a ball-grid array (BGA) package for integrated circuit die 12A. Integrated circuit die 12A is bonded to the top side of a substrate 13C on which a plurality of circuit paths 20D are fabricated via etching, plating or sputtering. Circuit paths 20D may be formed above the top surface of substrate 13A or may be embedded beneath the surface by laser ablating channels, embossing the substrate or other means. Circuit paths 20D terminate in bond pads 22C on which wires 15 are bonded, connecting integrated circuit terminals to circuit paths 20D. A cover 14 is applied over integrated circuit die 12A and attached to substrate 13C to protect the assembly from environmental conditions and handling damage. A plurality of solder balls 16A are attached to pads 19D for connecting integrated circuit die 12A to external circuits. Pad 19D is connected to multiple vertical vias 18D that lie within a cylinder having an axial cross section defined by the circumference of pad 19D. Circuit paths 20D individually extend from vias 18D to connect to other power connections within the integrated circuit (generally connections to power or ground terminals on one or more semiconductor dies).

Figure 2B:
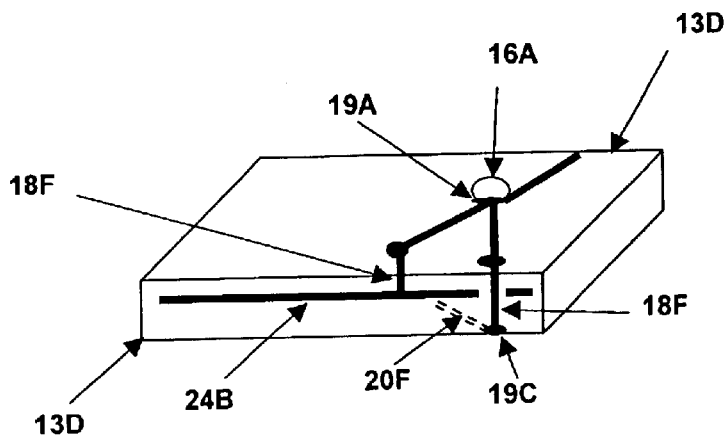
FIG. 2B is a pictorial diagram depicting features of a substrate circuit in accordance another embodiment of the invention.

Referring now to FIG. 2B, a bottom view of a substrate 13D in accordance with another embodiment of the present invention is depicted. Substrate 13D a ball-grid array (BGA) substrate for mounting an integrated circuit die. Pad 19F includes multiple conductive path 20F connections which may be fabricated via etching, plating or sputtering. Circuit paths 20F may be formed above the surfaces of substrate 13D or may be embedded beneath the surfaces by laser ablating channels, embossing the substrate or other means. Circuit paths 20F include connections from pad 19C to a power plane 24B through a via 18F and connections to the top side of substrate 13D through a through via 18G providing power connections to integrated circuit terminals.

Figure 2C:
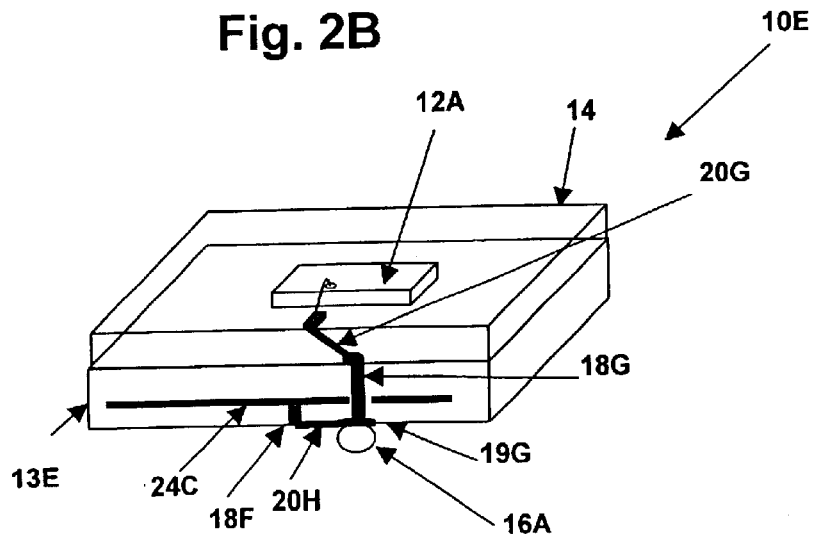
FIG. 2C is a pictorial diagram depicting features of an integrated circuit in accordance with another embodiment of the invention.

Referring now to FIG. 2C, an integrated circuit 10E in accordance with another embodiment of the invention is depicted. Integrated circuit 10E is a ball-grid array (BGA) package for integrated circuit die 12A. Integrated circuit die 12A is bonded to the top side of a substrate 13E on which a plurality of circuit paths 20G are fabricated via etching, plating or sputtering. Another circuit path 20H connects pad 19G to a power plane 24C through a via 18G. Another via 18F provided above pad 19G connects pad 19G to circuit path 20G. Circuit path 20G an circuit path 20H thus provide multiple connections from pad 19G to a power plane 24C and semiconductor die 12A connections. A cover 14 is attached to substrate and covers semiconductor die 12A from external environment and handling damage.

The above description of embodiments of the invention is intended to be illustrative and not limiting. Other embodiments will be obvious to those skilled in the art in disclosure and fall within the scope of the present invendtion.

What is claimed is:

1. An integrated circuit, comprising:
   at least one integrated circuit die;
   a substrate for mounting and electrically interconnecting the at least one integrated circuit die, wherein the substrate includes a plurality of terminal pads for connection to external terminals of the integrated circuit, and a plurality of bond pads for connection to terminals of the at least one integrated circuit die, and wherein at least two power connections from among the plurality of bond pads are connected to a single one of the terminal pads; and
   a cover for covering the at least one integrated circuit die, disposed over the at least one integrated circuit die and attached to the substrate.

2. The integrated circuit of claim 1, wherein the at least two power connections are provided by multiple conductive paths disposed on a first side of the substrate and the single terminal pad is also disposed on the first side of the substrate.

3. The integrated circuit of claim 1, wherein the at least two power connections are provided by multiple conductive paths disposed on a first side of the substrate and the single terminal pad is disposed on an opposite side of the substrate, and wherein the multiple conductive paths terminate in a conductive via connected from the first side of the substrate to the opposite side of the substrate.

4. The integrated circuit of claim 3, wherein the via is located within a cylinder having an axial cross-section defied by a circumference of the single terminal pad.

5. The integrated circuit of claim 3, wherein the via has a circumference intersecting a circumference of the single terminal pad, whereby the via and the single terminal pad are connected.

6. The integrated circuit of claim 1, wherein the at least two power connections are provided by multiple conductive paths disposed on a first side of the substrate and the single terminal pad is disposed on an opposite side of the substrate, and wherein the multiple conductive paths terminate in multiple conductive vias connected from the first side of the substrate to the opposite side of the substrate.

7. The integrated circuit of claim 6, wherein all of the multiple vias are located within a cylinder having an axial cross-section defined by the circumference of the single terminal pad.

8. The integrated circuit of claim 1, wherein the integrated circuit is a ball grid array (BGA), wherein the single terminal pad is a circular pad and further comprising a solder ball attached to the circular pad.

9. The integrated circuit of claim 1, wherein the integrated circuit is a land grid array (LGA), wherein the single terminal pad is a circular pad, and further comprising a land attached to the pad.

10. An integrated circuit, comprising:
    at least one integrated circuit die;
    a substrate for mounting and electrically interconnecting the at least one integrated circuit die, wherein the substrate includes a plurality of terminal pads for connection to external terminals of the integrated circuit, and a plurality of bond pads for connection to terminals of the at least one integrated circuit die, and wherein the substrate comprises means for interconnecting at least two power connections from among the plurality of bond pads with to a single one of the terminal pads.

11. The integrated circuit of claim 10, wherein the means for interconnecting comprises multiple conductive vias.

12. The integrated circuit of claim 10, wherein the means for interconnecting comprises at least one conductive via.

13. The integrated circuit of claim 10, wherein the means for interconnecting is located within a cylinder having an axial cross-section defined by a circumference of the single terminal pad.

14. A substrate for coupling an integrated circuit to a plurality of external terminals, comprising:
    at least one integrated circuit die;
    a substrate for mounting and electrically interconnecting the at least one integrated circuit die, wherein the substrate includes a plurality of terminal pads for connection to external terminals of the integrated circuit, and a plurality of bond pads for connection to terminals of the at least one integrated circuit die, and wherein at least two power connections from among the plurality of bond pads are connected to a single one of the terminal pads; and
    a cover for covering the at least one integrated circuit die, disposed over the at least one integrated circuit die and attached to the substrate.

15. The substrate of claim 15, wherein the integrated circuit is a ball grid array (BGA), wherein the single terminal pad is a circular pad and further comprising a solder ball attached to the circular pad.

16. The substrate of claim 14, wherein the integrated circuit is a land grid array (LGA), wherein the single terminal pad is a circular pad and further comprising a land attached to the circular pad.

17. An integrated circuit, comprising:
    at least one integrated circuit die; and
    means for mounting and electrically interconnecting the at least one integrated circuit die, wherein the means includes a plurality of terminal pads for connection to external terminals of the integrated circuit, and a plurality of bond pads for connection to terminals of the at least one integrated circuit die, wherein the means for mounting has means for interconnecting at least two power connections from among the plurality of bond pads to a single one of the terminal pads.

18. An integrated circuit in accordance with claim 17 further comprising means for covering the at least one integrated circuit die and coupled to the substrate.

19. An integrated circuit in accordance with claim 18 wherein the at least two power connections are provided by multiple conductive paths disposed on a first side of the substrate and the single terminal pad is also disposed on the first side of the substrate.

20. An integrated circuit in accordance with claim 18 wherein the at least two power connections are provided by multiple conductive paths disposed on a first side of the substrate and the single terminal pad is also disposed on an opposite side of the substrate, and wherein the multiple conductive paths terminate in a conductive via connected from the first side of the substrate to the opposite side of the substrate.

* * * * *